(12) United States Patent
Hashimoto (10) Patent No.: US 7,760,512 B2
(45) Date of Patent: Jul. 20, 2010

(54) ELECTRONIC BOARD, METHOD OF MANUFACTURING THE SAME, AND ELECTRONIC DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 1081 days.

(21) Appl. No.: 11/440,377

(22) Filed: May 24, 2006

(65) Prior Publication Data

US 2006/0284323 A1 Dec. 21, 2006

(30) Foreign Application Priority Data

Jun. 21, 2005 (JP) .............................. 2005-180401

(51) Int. Cl.
*H05K 7/00* (2006.01)
(52) U.S. Cl. .................. 361/760; 174/262; 174/263; 174/264; 174/265; 174/266
(58) Field of Classification Search ............... 361/760, 361/770–774; 257/782; 174/262–268
See application file for complete search history.

(56) References Cited

U.S. PATENT DOCUMENTS

| | | | |
|---|---|---|---|
| 5,834,844 A | 11/1998 | Akagawa et al. | |
| 5,960,308 A | 9/1999 | Akagawa et al. | |
| 6,921,977 B2 * | 7/2005 | Shimizu et al. | 257/758 |
| 7,015,090 B2 | 3/2006 | Okazaki et al. | |
| 7,029,946 B2 | 4/2006 | Murata | |
| 7,314,780 B2 | 1/2008 | Shimizu et al. | |
| 2003/0006493 A1 * | 1/2003 | Shimoishizaka et al. | 257/686 |
| 2006/0033141 A1 | 2/2006 | Okazaki et al. | |

FOREIGN PATENT DOCUMENTS

| | | |
|---|---|---|
| CN | 1487583 A | 4/2004 |
| CN | 1518094 A | 8/2004 |
| CN | 1622311 A | 6/2005 |
| JP | 02-162820 | 6/1990 |
| JP | 08-330313 | 12/1996 |
| JP | 2000-340955 | 12/2000 |
| JP | 2000-353875 | 12/2000 |
| JP | 2001-156456 | 6/2001 |
| JP | 2003-133476 | 5/2003 |

* cited by examiner

*Primary Examiner*—Jinhee J Lee
*Assistant Examiner*—Abiy Getachew
(74) *Attorney, Agent, or Firm*—Harness, Dickey & Pierce, P.L.C.

(57) ABSTRACT

An electronic board includes a substrate on which is formed an electronic circuit having a connection terminal; a stress-relaxation layer formed on the substrate; a rearrangement wiring for the connection terminal disposed at a top side of the stress-relaxation layer; and a capacitor. The capacitor has a first electrode that is disposed between the substrate and the stress-relaxation layer, a second electrode that is disposed at the top side of the stress-relaxation layer, and a dielectric material that is disposed between the first electrode and the second electrode. The first electrode and/or the second electrode has a corrugated surface facing the dielectric material.

8 Claims, 9 Drawing Sheets

ELECTRONIC BOARD, METHOD OF MANUFACTURING THE SAME, AND ELECTRONIC DEVICE

CROSS-REFERENCE TO RELATED APPLICATION

This application claims priority to Japanese Patent Application No. 2005-180401, filed Jun. 21, 2005, the contents of which are incorporated herein by reference.

BACKGROUND

1. Technical Field

The present invention relates to an electronic board, a method of manufacturing the electronic board, and an electronic device.

2. Related Art

Electronic devices such as mobile telephones and personal computers have mounted therein a semiconductor chip (electronic board) whereon an electronic circuit is formed. Such a semiconductor chip is used with passive elements such as resistors, inductors and capacitors. Japanese Unexamined Patent Application, First Publication Nos. 2000-340955, 2000-353875, and 2001-156456 disclose techniques of forming a capacitor on a substrate on which a semiconductor chip is mounted. In addition, Japanese Unexamined Patent Application, First Publication No. H02-162820 discloses a technique of forming a MOS capacitor on a semiconductor chip.

Since techniques to form a capacitor on a semiconductor chip-mounting substrate entail the capacitor being disposed away from transistors on the semiconductor chip, it is difficult to ensure the response characteristics and high-frequency characteristics of the capacitor. In addition, since a gate film is used as a dielectric layer in techniques to manufacture a MOS capacitor on a semiconductor chip, it is difficult to ensure the capacitance value of a capacitor. Moreover, since transistors cannot be formed in the capacitor formation region, a dedicated occupancy area is needed for the capacitor formation region, which leads to an increase in the size of the semiconductor chip on which a capacitor is formed.

SUMMARY

An advantage of some aspects of the invention is to provide an electronic board having excellent electrical characteristics, a manufacturing method therefor, and an electronic device employing the electronic board.

An electronic board according to a first aspect of the invention, includes: a substrate on which is formed an electronic circuit having a connection terminal; a stress-relaxation layer formed on the substrate; a rearrangement wiring for the connection terminal, disposed at a top side of the stress-relaxation layer; and a capacitor having a first electrode that is disposed between the substrate and the stress-relaxation layer; a second electrode that is disposed at the top side of the stress-relaxation layer; and a dielectric material that is disposed between the first electrode and the second electrode, wherein the first electrode and/or the second electrode has a corrugated surface facing the dielectric material. It is preferable that the stress-relaxation layer include the dielectric material.

According to this constitution, the surface area of the first electrode and/or the second electrode is greater compared to the case of the inner surface of the first electrode and/or the second electrode being a flat surface, therefore, the capacitance value of the capacitor increases. Accordingly, an electronic board having excellent electrical characteristics is provided. Also, since the contact area between the first electrode and/or the second electrode and the adjacent layer increases, the adhesion strength between the two rises. In addition, it is possible to form transistors in the capacitor formation region, and so an increase in size of the semiconductor chip accompanying the capacitor formation is averted.

Also, it is preferable that a projection electrode be formed on the surface of the second electrode.

This constitution allows for the shortest wiring length between the capacitor and the projection electrode, which is advantageous for impedance matching. Accordingly, an electronic board having excellent electrical characteristics can be provided.

Also, it is preferable that a passivation film of the substrate be disposed between the substrate and the stress-relaxation layer, and the first electrode be disposed between the substrate and the passivation film.

Also, the first electrode may serve as the connection terminal of the electronic circuit.

This constitution allows for the shortest wiring length from the electronic circuit to the capacitor and can minimize parasitic capacitance and stub length due to wiring. Accordingly, an electronic board having excellent electrical characteristics can be provided.

Also, it is preferable that the stress-relaxation layer be made of a material in which ceramic powder is dispersed in the dielectric material.

Dispersing the ceramic powder, which is a high dielectric material, can raise the dielectric constant of the capacitor. Accordingly, an electronic board having excellent electrical characteristics can be provided.

Also, it is preferable that the dielectric material be a resin material having photosensitivity.

This constitution enables the stress-relaxation layer to be accurately formed using photolithography, so that a capacitor having the desired characteristics is formed. Accordingly, an electronic board having excellent electrical characteristics can be provided.

A method of manufacturing an electronic board according to a second aspect of the invention, includes: forming a substrate on which is formed an electronic circuit having a connection terminal; forming a stress-relaxation layer on a substrate; forming a first electrode, the first electrode disposed between the substrate and the stress-relaxation layer; forming a second electrode, the second electrode disposed at a top side of the stress-relaxation layer; arranging a dielectric material layer on the substrate, the dielectric material disposed between the first electrode and the second electrode; forming a corrugated surface on at least one of the stress-relaxation layer and the dielectric material layer, the corrugated surface being adjacent to the first electrode and/or the second electrode; and forming rearrangement wiring for the connection terminal, the rearrangement wiring disposed at the top side of the stress-relaxation layer.

According to this constitution, the inner surface of the first electrode and/or the second electrode becomes a corrugated surface, and so the surface area of the first electrode and/or the second electrode is greater compared to the case of the inner surface being a flat surface, therefore, the capacitance value of the capacitor increases. Accordingly, an electronic board having excellent electrical characteristics is provided. Also, the adhesion strength between the first electrode and/or the second electrode and the adjacent layer thereto increases.

Also, the dielectric material layer may be the stress-relaxation layer. According to this constitution, a capacitor can be formed at a low cost.

Formation of the corrugations can be performed by, for example, photolithography, etching, or a transfer method. Thereby, the corrugations can be easily and reliably formed.

An electronic device according to the present invention is characterized by being provided with the aforementioned electronic board.

This constitution can provide an electronic device having excellent electrical characteristics.

DESCRIPTION OF EXEMPLARY EMBODIMENTS

Hereinbelow, the embodiments of the present invention shall be explained with reference to the accompanying drawings. The dimensional scale of the constituent elements in the drawings has been altered to aid recognition of the elements.

First Embodiment

The semiconductor chip (electronic board) according to the present embodiment is one in which a stress-relaxation layer is formed on the surface of a semiconductor chip having an electronic circuit formed thereon, with rearrangement wiring for connection terminals of the electronic circuit formed on the surface of the stress-relaxation layer. The rearrangement wiring for the connection terminals and the stress-relaxation layer shall be initially explained.

Rearrangement Wiring

Figure 1A:
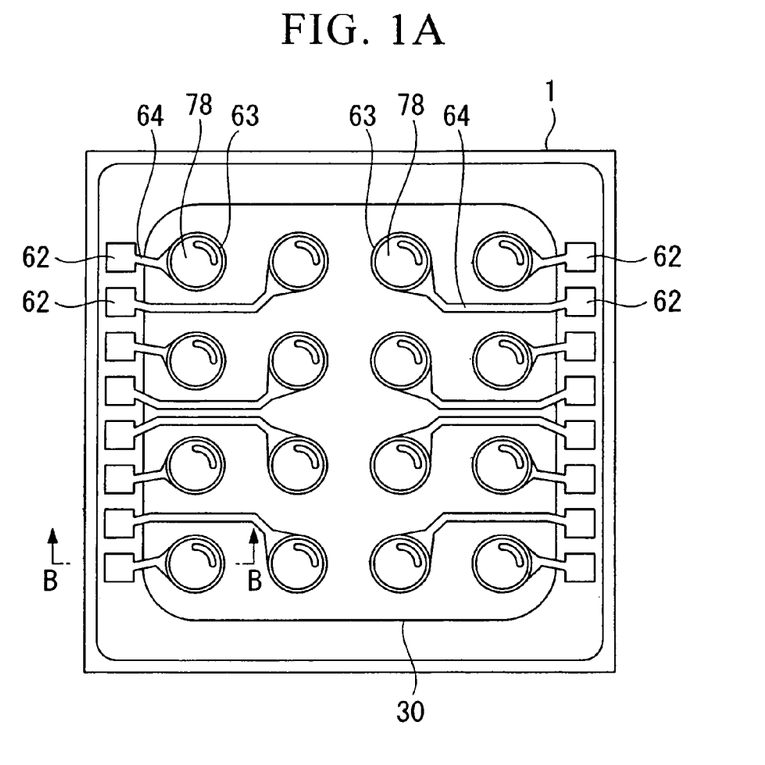
FIG. 1A is an explanatory drawing of the rearrangement wiring, and a plan view of the semiconductor chip.
Figure 1B:
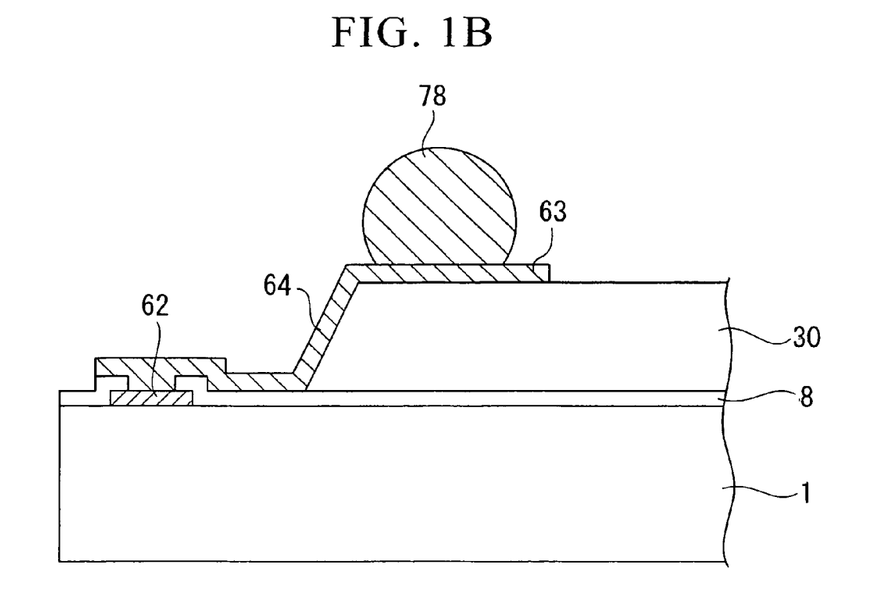
FIG. 1B is an explanatory drawing of the rearrangement wiring, and a longitudinal sectional view of the rearrangement wiring along line B-B in FIG. 1A.

FIG. 1A and FIG. 1B are explanatory drawings of the rearrangement wiring, with FIG. 1A being a plan view of the semiconductor chip, and FIG. 1B being a side sectional view of the rearrangement wiring along line B-B in FIG. 1A. As shown in FIG. 1B, a passivation film 8 for protecting the electronic circuit is formed on the surface of the semiconductor chip on which the electronic circuit is formed. A connection terminal 62 for external electrical connection of the electronic circuit is formed on the surface of the semiconductor chip. The passivation film 8 has an opening that exposes the surface of the connection terminal 62.

As shown in FIG. 1A, a plurality of the connection terminals 62 are arranged along the edge portions of a semiconductor chip 1. The pitch between adjacent connection terminals 62 becomes extremely narrow as the size of the semiconductor chip is reduced. As a result, mounting the semiconductor chip 1 on an opposite substrate leads to the possibility of short-circuiting between adjacent connection terminals 62. Rearrangement wiring 64 for the connection terminals 62 is therefore formed in order to increase the pitch between the connection terminals 62.

Specifically, a plurality of pads 63 are arranged in a matrix in the center portion of the surface of the semiconductor chip 1. The rearrangement wiring 64 of the connection terminals 62 is connected to the pads 63. The connection terminals 62 are thereby drawn into the center portion of the semiconductor chip 1 so that the narrow pitch of the connection terminals 62 is widened. Wafer-level Chip Scale Package (W-CSP) technology is used to form such semiconductor chips, whereby the rearrangement wiring and resin sealing are collectively applied on a wafer, which is then divided into individual chips.

When forming semiconductor chips using W-CSP technology, it is necessary to relax the stress generated by the difference in the thermal expansion coefficients of the opposite substrate that is mounted on the semiconductor chip and the semiconductor chip. As shown in FIG. 1B, there is formed in the center portion of the surface of the semiconductor chip a stress-relaxation layer 30 that consists of photosensitive polyimide or photosensitive polymer such as benzo cyclo butane (BCB) and phenolic novolac resin. The aforementioned pads 63 are then formed on the surface of the stress-relaxation layer 30.

A bump 78 is formed on the surface of each pad 63. This bump 78 is, for example, a soldering bump and is formed by a printing method or the like. This bump 78 is mounted on the connection terminal of an opposite substrate by reflow soldering and flip chip bonding (FCB) and the like. It is also possible to mount the pads 63 of the semiconductor chip 1 on the connection terminals of the opposite substrate by means of an anisotropic conductive film and the like.

Electronic Substrate Provided With a Capacitor

Figure 2A:
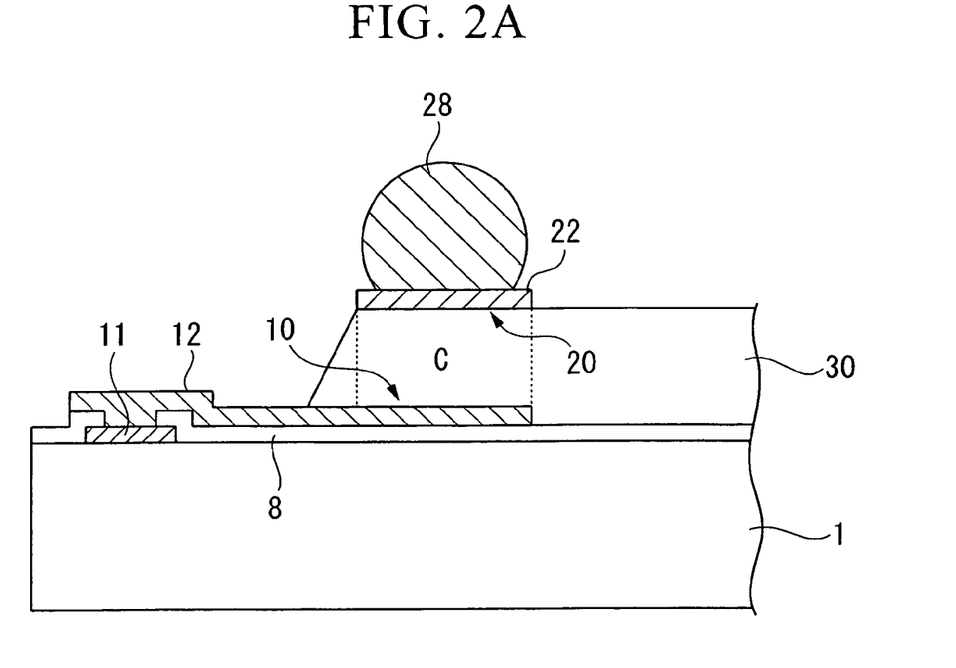
FIG. 2A is a longitudinal sectional view of the semiconductor chip according to the first embodiment.
Figure 2B:
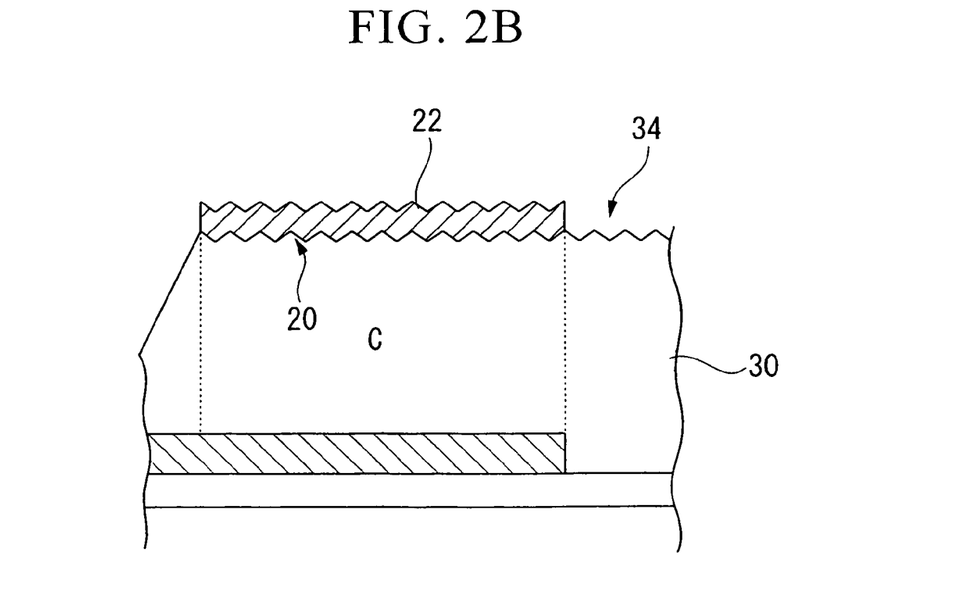
FIG. 2B is an enlarged longitudinal sectional view of the semiconductor chip according to the first embodiment.

FIGS. 2A and 2B show the semiconductor chip according to the first embodiment. FIG. 2A is a side sectional view of the portion corresponding to the line B-B of FIG. 1A, and FIG. 2B is an enlarged view of the capacitor C. As shown in FIG. 2A, the semiconductor chip (electronic board) according to the first embodiment has a first electrode 10 that is formed at the back side of the stress-relaxation layer 30; a second electrode 20 formed at the top side of the stress-relaxation layer 30; and the stress-relaxation layer 30, which consists of a dielectric material, disposed between the first electrode 10 and the second electrode 20. A capacitor C is thus formed by the first electrode 10, the second electrode 20, and the stress-relaxation layer 30.

As shown in FIG. 2A, a first layer wiring 12 consisting of a conductive material such as Cu is extended from the surface of a connection terminal 11 to the central portion of the surface of the semiconductor chip 1. The distal end of the first layer wiring 12 is disposed so as to oppose a second layer wiring 22, sandwiching the stress-relaxation layer 30 therebetween. The first layer wiring 12 is formed on the surface of an underlying layer described below, the underlying layer being omitted from FIG. 2.

The stress-relaxation layer 30 is formed so as to cover the distal end portion of the first layer wiring 12. The stress-relaxation layer 30 as stated above is composed of a dielectric material such as photosensitive polyimide or photosensitive polymer such as benzo cyclo butane (BCB) and phenolic novolac resin.

The second layer wiring 22, which consists of a conductive material such as Cu, is formed on the stress-relaxation layer 30. The second layer wiring 22 is formed in an aforementioned pad shape, being disposed so as to oppose the distal end portion of the first layer wiring 12, sandwiching the stress-relaxation layer 30 therebetween. The second layer wiring 22 is formed on the surface of an underlying layer described below, the underlying layer being omitted from FIGS. 2A and 2B.

When the semiconductor chip 1 is viewed from a direction perpendicular to its surface (plan view), the capacitor C is formed in the region where the first layer wiring 12 and the second layer wiring 22 overlap (overlap region). That is, the first layer wiring 12 in the overlap region functions as a first electrode 10, and the second layer wiring 22 in the overlap region functions as a second electrode 20. The stress-relaxation layer 30 consisting of a dielectric material is disposed between the first electrode 10 and the second electrode 20, thereby forming the capacitor C.

As shown in FIG. 2B, corrugations 34 are formed on the surface of the stress-relaxation layer 30. The corrugations 34 may be of any shape, such as dot shaped or line shaped, and the pitch and height of the corrugations 34 may be arbitrarily set. The corrugations 34 are formed in at least a portion of the overlap region, and preferably formed over the overlap region, and may also be formed over the entire surface of the stress-relaxation layer 30. The second layer wiring 22 is formed on the surface of the stress-relaxation layer 30, with the inner surface of the second electrode 20 being a corrugated surface. Since the surface area of the second electrode 20 is thereby greater compared to the case of the inner surface being a flat surface, the capacitance value of the capacitor can be increased.

Returning to FIG. 2A, a bump (projection electrode) 28 mentioned above is formed on the second layer wiring 22 that is formed in a pad shape. The capacitor C is disposed between the electronic circuit of the semiconductor chip and the opposite substrate. Forming the bump 28 on the surface of the second electrode 20 allows for the shortest wiring length from the capacitor C to the bump 28, which is advantageous for impedance matching.

Ceramic powder, which is a high dielectric material, may be dispersed (kneaded) into the dielectric material constituting the stress-relaxation layer 30. Specifically, ceramic powder such as $TiBaO_3$ or $Al_2O_3$ may be used. By adjusting the powder distribution ratio and particle size distribution, a capacitor having the desired capacitance and high-frequency characteristics can be obtained. For example, finely filling powder with small particles can raise the dielectric constant of the capacitor. In addition, different types of high dielectric materials may be mixed together. For example, by suitably mixing a material having a positive temperature characteristic with a material having a negative temperature characteristic at a suitable ratio, the apparent temperature characteristic can be flattened. Moreover, using two or more types of resins enables resin velocity adjustment. In addition, by appropriately selecting the method of applying the resin, thickness control of the stress-relaxation layer 30 can be easily performed.

A dielectric material layer may be formed separate to the stress-relaxation layer 30 between the first electrode 10 and the second electrode 20. It is preferable to form a ceramic material layer of a high dielectric constant by the sol-gel method. This constitution can further raise the dielectric constant of the capacitor.

Manufacturing Method of the Electronic Substrate

Next, the method of manufacturing the aforementioned semiconductor chip shall be explained using FIGS. 3A to 3H.

Figure 3A:
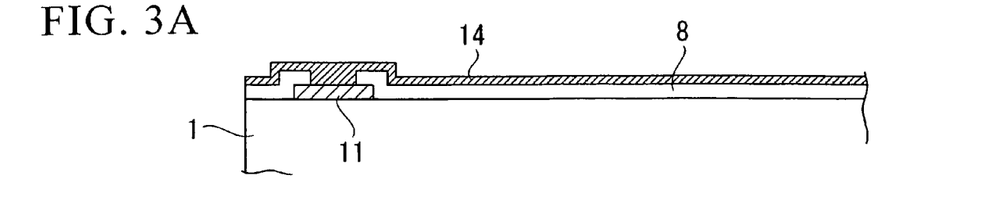
FIGS. 3A, 3B, 3C, 3D, 3E, 3F, 3G, and 3H are process drawings of the manufacturing method of a semiconductor chip according to the first embodiment.

FIGS. 3A to 3H are process drawings of the method of manufacturing the semiconductor chip according to the present embodiment. As shown in FIG. 3A, the passivation film 8 for protecting the electronic circuit and the connection terminal 11 for external electrical connection of the electronic circuit are formed on the surface of the semiconductor chip on which the electronic circuit is formed. Also, an opening in the passivation film 8 is formed as the position of the surface of the connection terminal 11.

As first shown in FIG. 3A, an underlying film 14 is formed over entire surface of the semiconductor chip 1. The underlying film 14 consists of a barrier layer as the bottom layer and a seed layer as the top layer. The seed layer, formed of Cu or the like to a thickness of several hundred nm or thereabout, functions as an electrode when forming the first layer wiring by an electrolytic plating method. The barrier layer, formed of TiW or TiN to a thickness of 100 nm or thereabout, prevents diffusion of the Cu to the connection terminals made of Al and the like. It is possible to form these layers using a physical vapor deposition (PVD) method such as vacuum evaporation, sputtering or ion plating, or an ion metal plasma (IMP) method.

Figure 3B:
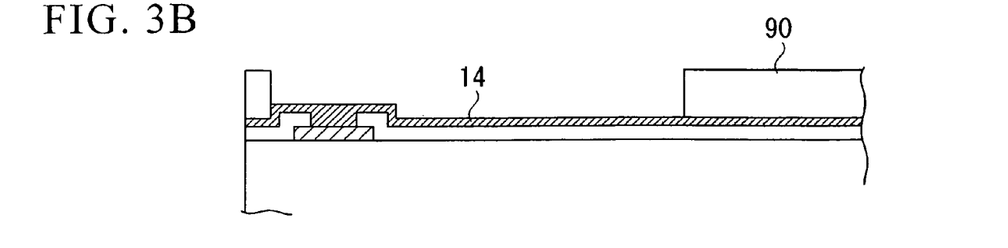

As shown next in FIG. 3B, a resist 90 is applied to the surface of the underlying film 14, and an opening of the resist 90 is formed in the formation region of the first layer wiring by photolithography.

Figure 3C:
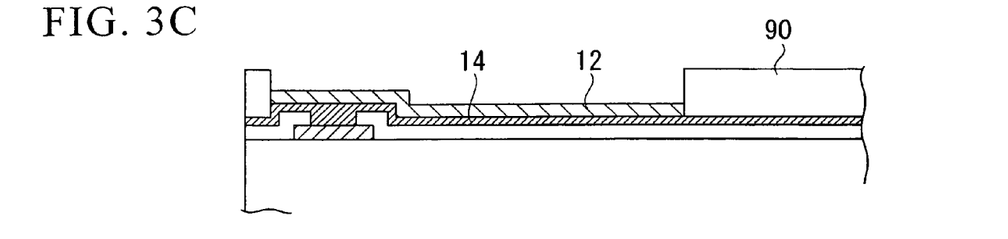

As shown next in FIG. 3C, electrolytic Cu plating is performed with the seed layer of the underlying film 14 serving as an electrode, and the first layer wiring 12 is formed by embedding Cu in the opening formed by the resist 90.

Figure 3D:
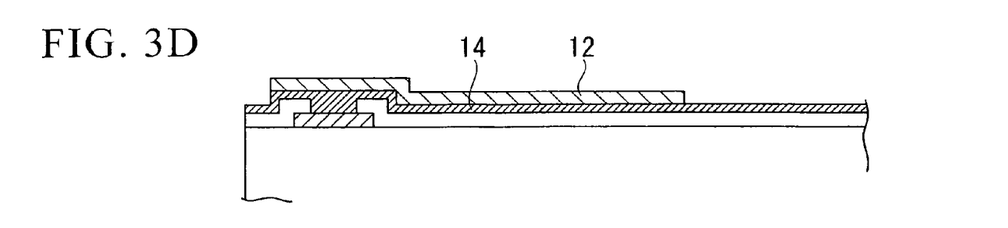

The resist is then stripped away, as shown next in FIG. 3D.

Figure 3E:
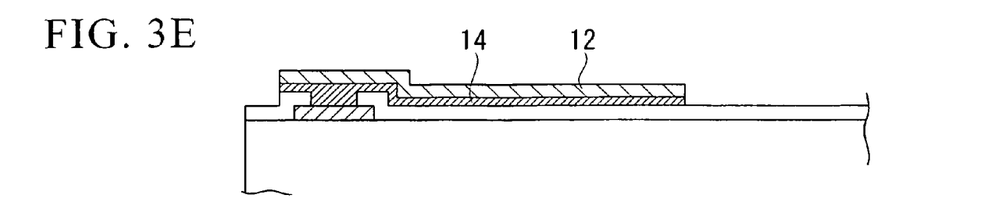

As shown next in FIG. 3E, etching of the underlying film 14 is performed with the first layer wiring 12 serving as a mask. It is possible to employ reactive ion etching (RIO) for this etching. While both the first layer wiring 12 and the seed layer of the underlying film 14 are constituted of Cu, since the first layer wiring 12 is sufficiently thicker than the seed layer of the underlying film 14, the seed layer can be completely removed by the etching.

Figure 3F:
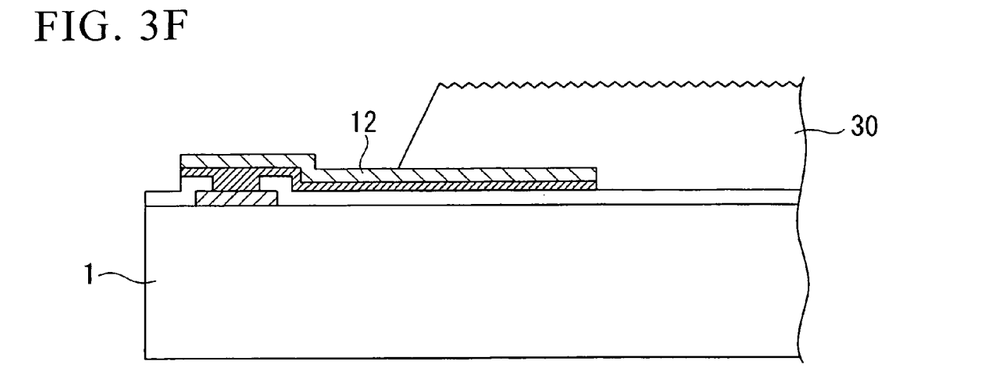

Next, as shown in FIG. 3F, the stress-relaxation layer 30 is formed so as to cover the distal end portion of the first layer wiring 12. The stress-relaxation layer 30 is formed in the center portion of the surface of the semiconductor chip using a printing method or photolithography. If a resin material that has photosensitivity is adopted as the dielectric material constituting the stress-relaxation layer 30, patterning of the stress-relaxation layer 30 can be readily and accurately performed using photolithography.

Corrugations are formed on the surface of the stress-relaxation layer 30. It is preferable that the formation of the corrugations be performed by etching of the surface of the stress-relaxation layer 30. Specifically, plasma etching is performed for a brief duration by introducing etching gas such as $O_2$ gas. In the event of performing affinity processing on the surface of the stress-relaxation layer 30 in order to ensure affinity with the second layer wiring of the upper layer, corrugations are often formed on the surface of the stress-relaxation layer 30 by that affinity processing. Even with plasma etching that entails introduction of O₂ gas and the like, corrugations can be formed on the surface of the stress-relaxation layer 30 while ensuring affinity with the second layer wiring.

It is also possible to form the corrugations using a transfer method (nano imprint) that transfers corrugated shapes onto the surface of the stress-relaxation layer 30. In this case, it is preferable to use a thermoplastic material as a component of the stress-relaxation layer 30. While heating a transfer mold on which the corrugations are reversibly formed, it is pressed onto the surface of the stress-relaxation layer 30. Thereafter, the stress-relaxation layer 30 is cooled, and the transfer mold is removed, revealing the corrugations to be formed on the surface of the stress-relaxation layer 30.

It is also possible to form the corrugations by photolithography. In this case, it is possible to form the corrugations on the surface of the stress-relaxation layer 30 substantially simultaneously with patterning of the stress-relaxation layer 30, thereby simplifying the manufacturing step. As the mask for the photolithography, a mask is adopted in which the corrugation formation region is a half-tone region. In addition, comparatively small corrugations made by the aforementioned etching or transfer method may be formed on the surfaces of the comparatively large corrugations formed by photolithography.

Figure 3G:
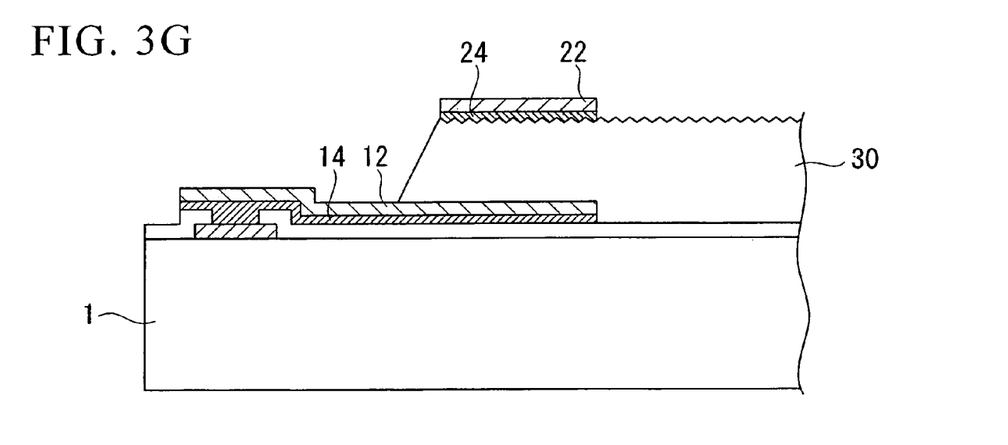

As shown next in FIG. 3G, the second layer wiring 22 and an underlying layer 24 thereof are formed on the surface of the stress-relaxation layer 30. The specific formation method is identical to the method of forming the first layer wiring 12 and the underlying film 14 thereof. By trimming the thus formed second layer wiring 22 with a laser or the like, it is possible to performing tuning of the capacitor characteristics.

Figure 3H:
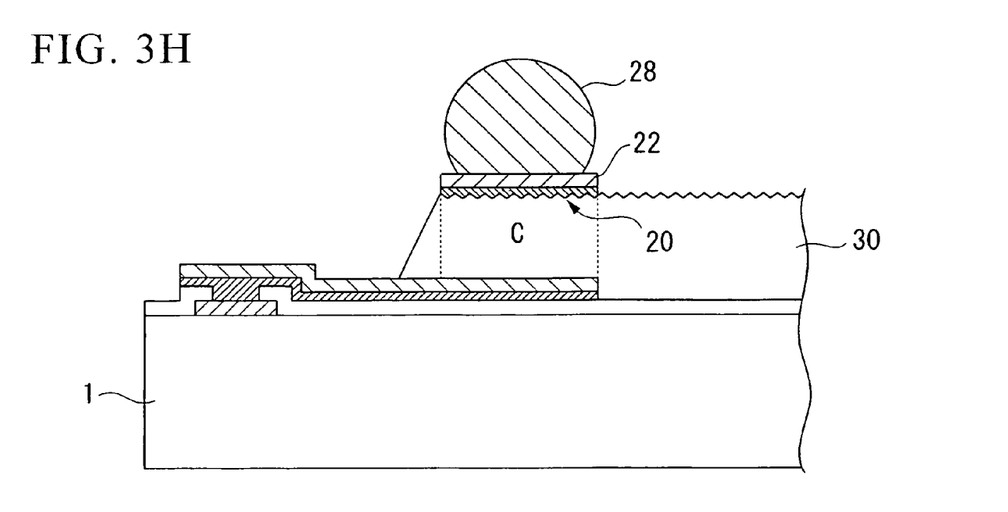

As shown next in FIG. 3H, a soldering bump is mounted on the surface of the second layer wiring 22 to form the bump 28.

The second layer wiring 22 is formed substantially simultaneously as the rearrangement wiring 64 shown in FIGS. 1A and 1B. That is, the second electrode 20 shown in FIG. 3H can be accurately formed by using plating or photolithography. Thereby, a capacitor C can be formed to have the desired characteristics. In addition, since the capacitor C is disposed near the electronic circuit of the semiconductor chip 1, the response characteristics and high-frequency characteristics of the capacitor C can be ensured. Moreover, by utilizing the stress-relaxation layer 30 as a dielectric layer, the capacitance value of the capacitor C can be freely set. Accordingly, the semiconductor chip 1 having excellent electrical characteristics can be provided.

Since the second layer wiring 22 is formed substantially simultaneously as the rearrangement wiring, and the stress-relaxation layer 30 is used as a dielectric layer, the capacitor C can be formed at a low cost. In addition, since transistors can be formed in the capacitor formation region, an occupancy region for the capacitor formation region is not required, so that there is no increase in the size of a semiconductor chip having a capacitor formed thereon.

In the semiconductor chip according to the present embodiment, the inner surface of the second electrode 20 is a corrugated surface. According to this embodiment, compared to the case of the inner surface being a flat surface, the surface area of the second electrode 20 in the same flat surface region increases, thereby increasing the capacitance value of the capacitor C. Accordingly, the semiconductor chip 1 having excellent electrical characteristics can be provided. In addition, since the contact surface area between the stress-relaxation layer 30 and the second electrode 20 increases, the adhesion strength between the stress-relaxation layer 30 and the second electrode 20 can be increased.

Second Embodiment

Figure 4A:
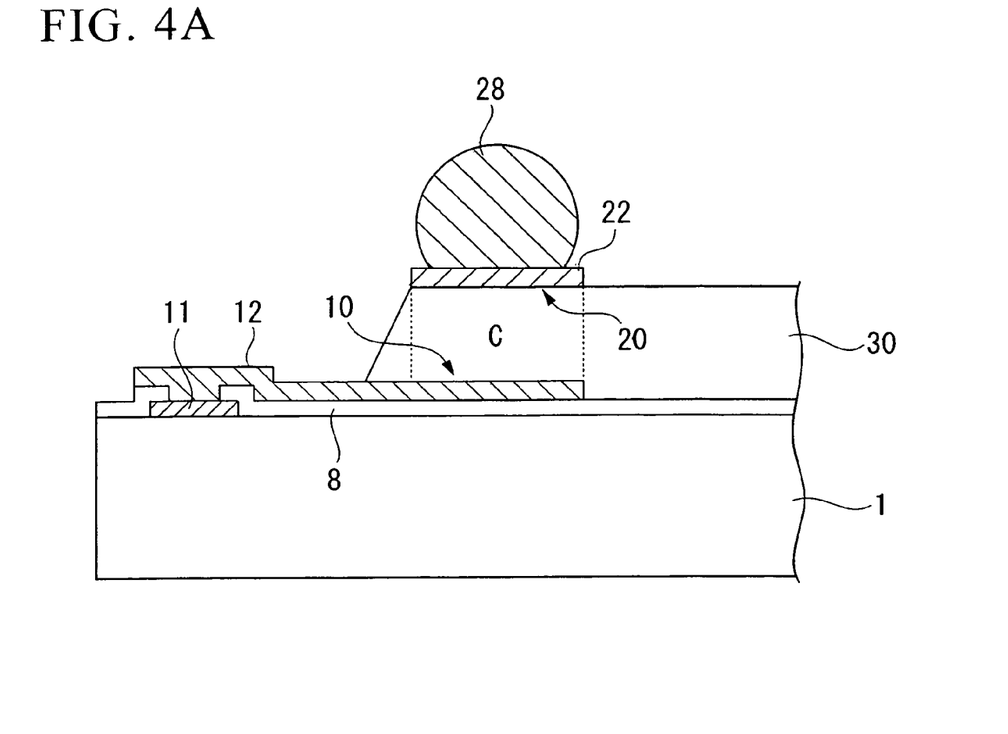
FIG. 4A is a longitudinal sectional view of the semiconductor chip according to the second embodiment.
Figure 4B:
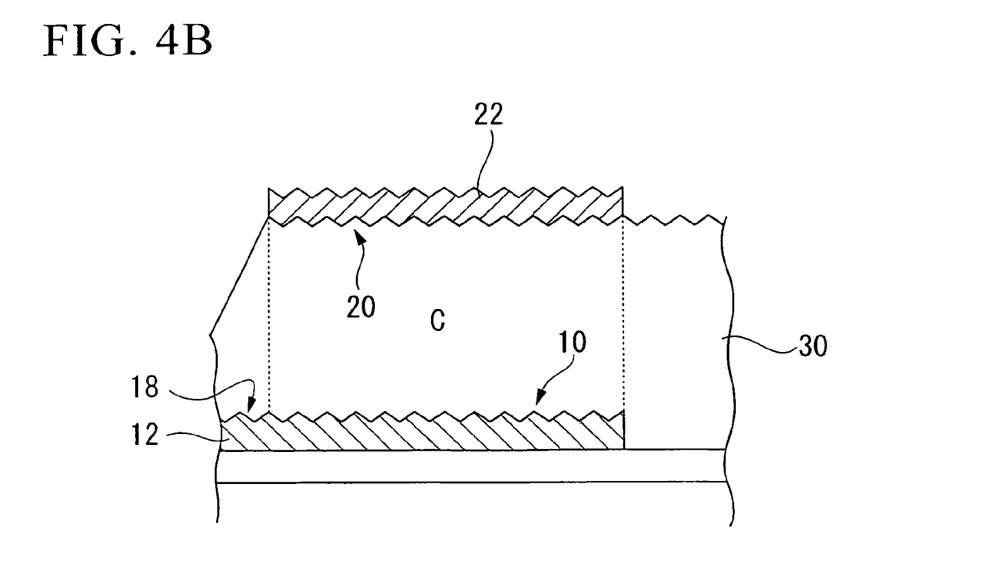
FIG. 4B is an enlarged longitudinal sectional view of the semiconductor chip according to the second embodiment.

FIGS. 4A and 4B show the semiconductor chip according to the second embodiment. FIG. 4A is a side sectional view of the portion corresponding to the line B-B in FIGS. 1A and 1B, and FIG. 4B is a magnified view of the capacitor C portion in FIG. 4A. While in the first embodiment the inner surface of the first electrode 10 is a flat surface, as shown in FIG. 4B the semiconductor chip (electronic board) according to the second embodiment differs on the point of the inner surface of the first electrode 10 being a corrugated surface. Detailed explanations for those constituent elements identical to the first embodiment shall be omitted.

In the second embodiment, corrugations 18 are formed on the surface of the first layer wiring 12. It is possible to form the corrugations 18 by etching the surface of the first layer wiring 12. Specifically, plasma etching is performed for a brief duration by introducing etching gas such as O₂ gas. In the event of performing affinity processing on the surface of the first layer wiring 12 in order to ensure affinity with the stress-relaxation layer 30 of the upper layer, corrugations are often formed on the surface of the stress-relaxation layer 30 by that affinity processing. Even with plasma etching that entails introduction of O₂ gas and the like, corrugations 18 can be formed on the surface of the first layer wiring 12 while ensuring affinity with the stress-relaxation layer 30.

In the event of forming the first layer wiring 12 by electrolytic Cu plating, it is also possible to form the first layer wiring 12 with the corrugations 18 formed on the surface thereof by raising the current density. In the event of forming the first layer wiring 12 by sputtering, it is possible to form the first layer wiring 12 with the corrugations 18 formed on the surface thereof by raising the sputter rate or performing sputtering at a low temperature.

Thus, in the semiconductor chip according to the second embodiment, the inner surface of the first electrode 10 is made to be a corrugated surface. Thereby, the surface area of the first electrode 10 is greater compared to the case of the inner surface being a flat surface, which can increase the capacitance value of the capacitor C. In addition, since the contact surface area between the stress-relaxation layer 30 and the first electrode 10 increases, the adhesion strength between the first electrode 10 and the stress-relaxation layer 30 can be increased.

In the second embodiment, the inner surface of the second electrode 20 is also made to be a corrugated surface, similar to the first embodiment. Thereby, the surface area of the second electrode 20 is greater compared to the case of the inner surface being a flat surface, which can further increase the capacitance value of the capacitor C. Accordingly, the semiconductor chip having excellent electrical characteristics can be provided.

Third Embodiment

Figure 5A:
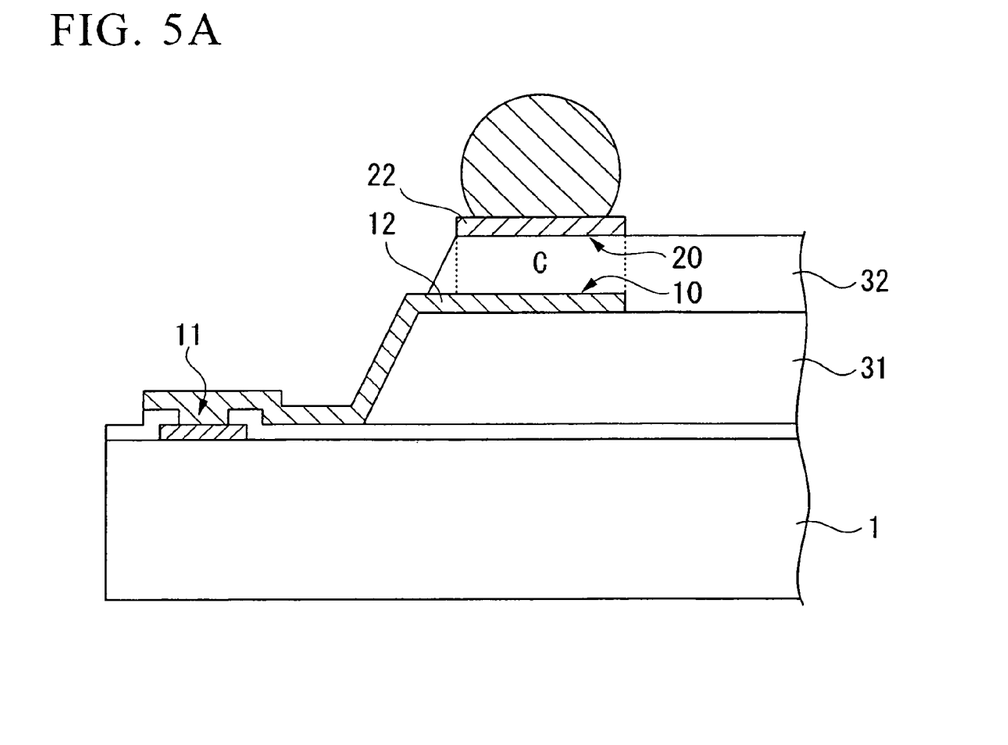
FIG. 5A is a longitudinal sectional view of the semiconductor chip according to the third embodiment.
Figure 5B:
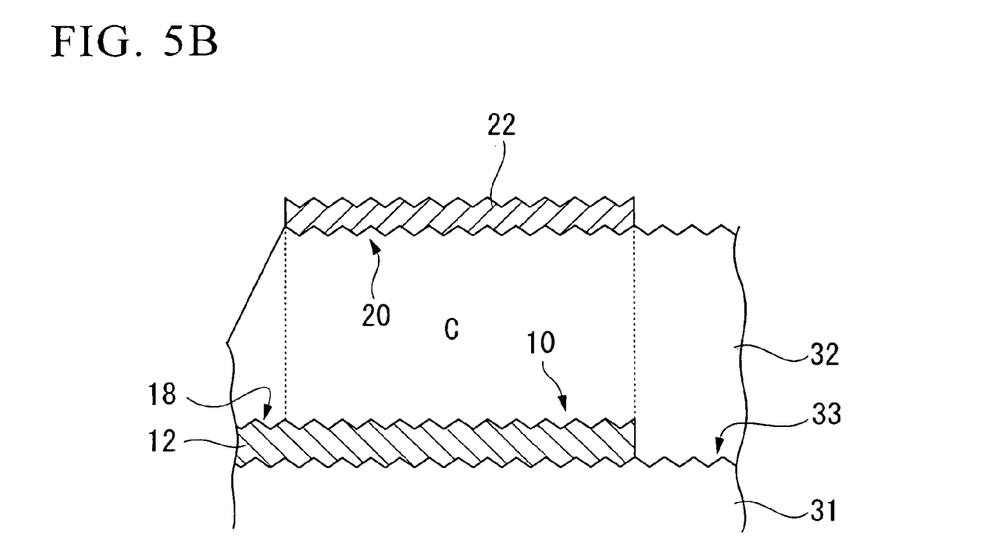
FIG. 5B is an enlarged longitudinal sectional view of the semiconductor chip according to the third embodiment.

FIGS. 5A and 5B show the semiconductor chip according to the third embodiment. FIG. 5A is a side sectional view of the portion corresponding to the line B-B in FIGS. 1A and 1B, and FIG. 5B is a magnified view of the capacitor C portion in FIG. 5A. The semiconductor chip (electronic board) according to the third embodiment differs from the aforementioned embodiments on the point of corrugations being formed on the surface of a first stress-relaxation layer 31 disposed on the back surface of the first electrode 10, and corrugations being formed on the surface of the first electrode 10 in accordance with the corrugations on the first stress-relaxation layer 31.

Detailed explanations for those constituent elements similar to the first embodiment shall be omitted.

As shown in FIG. 5A, in the semiconductor chip 1 according to the third embodiment, the first stress-relaxation layer 31 is formed in the center portion of the surface, and a second stress-relaxation layer 32 is formed on the surface of the first stress-relaxation layer 31. Also, the first layer wiring 12 is extended from the surface of the connection terminal 11 to the surface of the first stress-relaxation layer 31, and the second layer wiring 22 is formed on the surface of the second stress-relaxation layer 32. The capacitor C is formed in the region where, in the plan view, first layer wiring 12 and the second layer wiring 22 overlap (overlap region). That is, the first layer wiring 12 in the overlap region functions as the first electrode 10, and the second layer wiring 22 in the overlap region functions as the second electrode 20. The second stress-relaxation layer 32 consisting of a dielectric material is disposed between the first electrode 10 and the second electrode 20, thereby forming the capacitor C.

As shown in FIG. 5B, corrugations 33 are formed on the surface of the first stress-relaxation layer 31 disposed on the back side of the first electrode 10. The specific formation method is similar to that for the first embodiment. Corrugations 18 are formed on the surface of the first layer wiring 12 in accordance with the corrugations 33 on the first stress-relaxation layer 31. Thereby, the inner surface of the first electrode 10 becomes a corrugated surface, which can increase the capacitance value of the capacitor C similarly to the second embodiment. In addition, the adhesion strength between the first stress-relaxation layer 31 and the first electrode 10 and the adhesion strength between the first electrode 10 and the second stress-relaxation layer 32 can both be increased.

The third embodiment is a constitution that forms the corrugations 33 on the surface of the first stress-relaxation layer 31 disposed on the back side of the first electrode 10, and forms corrugations 18 on the surface of the first layer wiring 12 in accordance with the corrugations 33. Therefore, the inner surface of the first electrode 10 can be readily and accurately made into a corrugated surface.

Fourth Embodiment

Figure 6A:
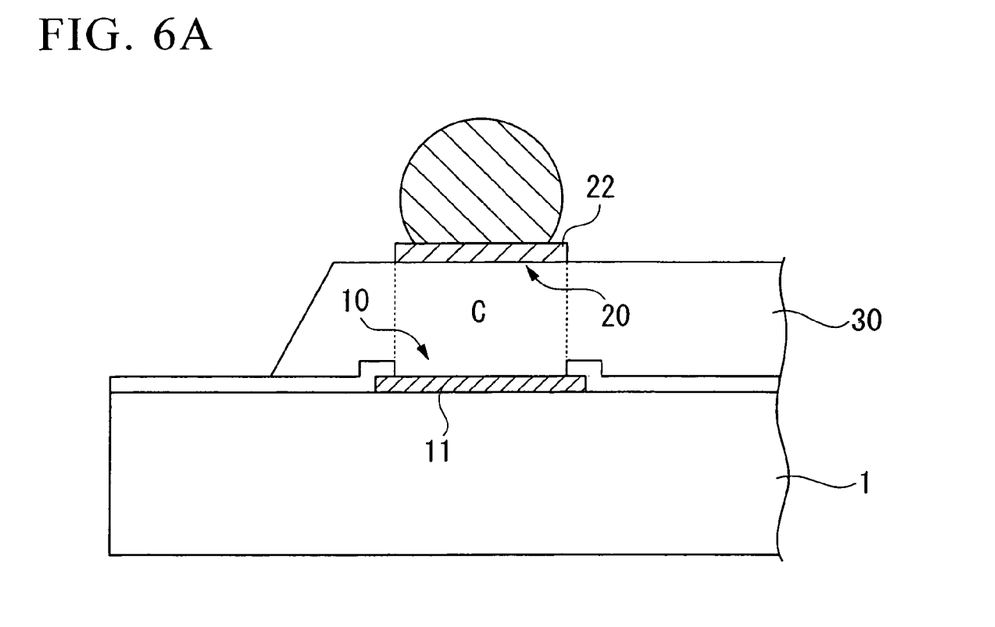
FIG. 6A is a longitudinal sectional view of the semiconductor chip according to the fourth embodiment.

FIG. 6A is a side sectional view of the semiconductor chip according to the fourth embodiment. While in the first embodiment the first layer wiring that is extended from the connection terminal functions as the first electrode, the fourth embodiment differs on the point of the connection electrode 11 functioning as the first electrode 10 of the capacitor C. Detailed explanations for those constituent elements similar to the first embodiment shall be omitted.

In the fourth embodiment, the stress-relaxation layer 30 is formed so as to cover the connection terminal 11. For that reason, a portion of the stress-relaxation layer 30 is either extended to the edge part of the surface of the semiconductor chip 1, or the connection terminal 11 is formed in advance toward the center portion of the semiconductor chip 1. The second layer wiring 22 is formed on the surface of the stress-relaxation layer 30 in the similar manner as in the first embodiment.

The capacitor C is formed in the region where in the plan view the connection terminal 11 and the second layer wiring 22 overlap (overlap region). That is, the connection terminal 11 in the overlap region functions as the first electrode 10, and the second layer wiring 22 in the overlap region functions as the second electrode 20. The stress-relaxation layer 30 consisting of a dielectric material is disposed between the first electrode 10 and the second electrode 20, thereby forming the capacitor C.

In the fourth embodiment, since the connection terminal 11 functions as the first electrode 10 of the capacitor C, the capacitor C can be formed just proximal to transistors contained in the electronic circuit of the semiconductor chip. Therefore, the wiring length from the transistor to the capacitor becomes the shortest, which can minimize the parasitic capacitance and stub length due to wiring. In particular, since there is an improvement in the electrical characteristics in the high-frequency region (in terms of loss, noise radiation), the charge-discharge characteristics of the capacitor also improve, which allows for downsizing of the capacitor. Accordingly, the electrical characteristics of the entire system can be improved, and a reduction in size can be realized.

Figure 6B:
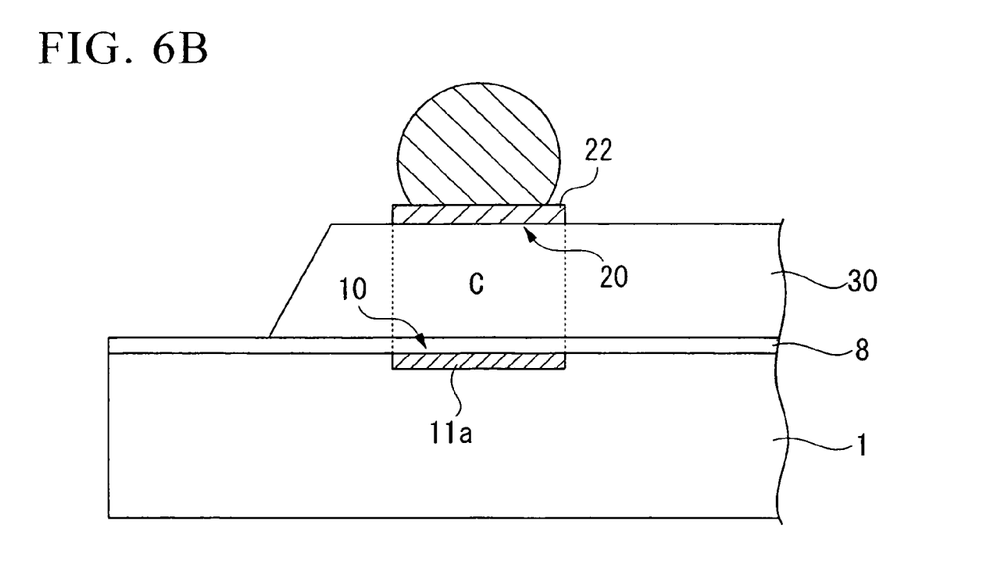
FIG. 6B is a longitudinal sectional view of a modification example of the semiconductor chip according to the fourth embodiment.

FIG. 6B shows a modification example of the semiconductor chip according to the fourth embodiment. In this modification example, an internal wiring 11a of the electronic circuit on the semiconductor chip is formed on the back surface of the passivation film 8. The capacitor C is formed in the region where in the plan view the internal wiring 11a and the second layer wiring 22 overlap (overlap region). That is, the internal wiring 11a in the overlap region functions as the first electrode 10, and the second layer wiring 22 in the overlap region functions as the second electrode 20. The stress-relaxation layer 30 and the passivation film 8 are disposed between the first electrode 10 and the second electrode 20, thereby forming the capacitor C.

In this modification example, there is no need to make an opening in the passivation film 8 at the surface of the internal wiring 11a, and so the manufacturing cost can be lowered.

By making the inner surface of the second electrode 20 a corrugated surface similarly to the first embodiment, the capacitance value of the capacitor C can be increased. Also, by making the inner surface of the first electrode 10 a corrugated surface similarly to the second and third embodiments, the capacitance value of the capacitor C can be increased. Accordingly, the electronic board 1 having excellent electrical characteristics can be provided.

Fifth Embodiment

Figure 7:
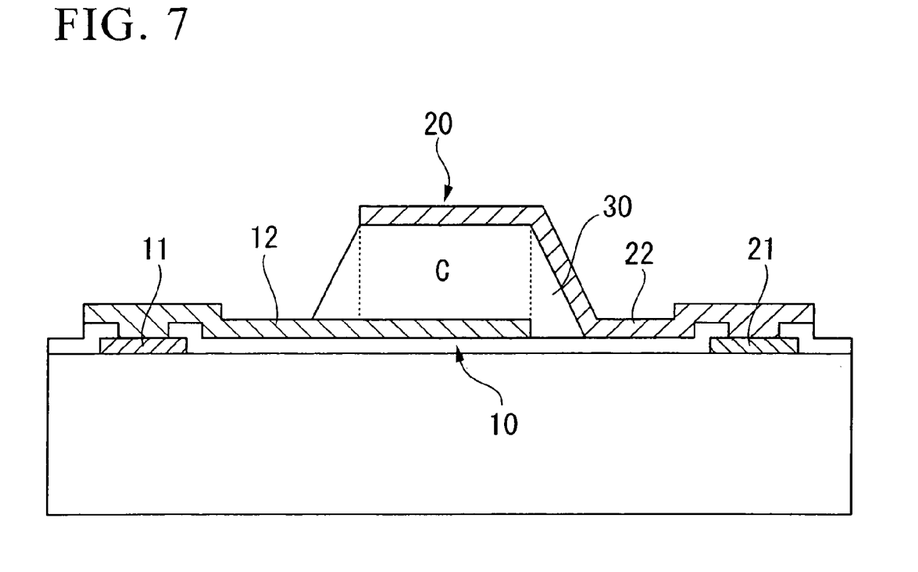
FIG. 7 is a longitudinal sectional view of the semiconductor chip according to the fifth embodiment.

FIG. 7 is a side sectional view of the semiconductor chip according to the fifth embodiment. While in the first embodiment the capacitor is disposed between the electronic circuit on the semiconductor chip and the opposite substrate, the fifth embodiment differs on the point of the capacitor being disposed within the electronic circuit on the semiconductor chip. Detailed explanations for those constituent elements identical to the first embodiment shall be omitted.

In the fifth embodiment, the first layer wiring 12 is extended from the surface of the first connection terminal 11. The stress-relaxation layer 30 is formed so as to cover the distal end portion of the first connection terminal 11. The second layer wiring 22 is extended from a second connection terminal 21, which is separate from the first connection terminal 11, to the surface of the stress-relaxation layer 30.

The capacitor C is formed in the region where, in the plan view, the first layer wiring 12 and the second layer wiring 22 overlap (overlap region). That is, the first layer wiring 12 in the overlap region functions as the first electrode 10, and the second layer wiring 22 in the overlap region functions as the second electrode 20. The stress-relaxation layer 30 consisting of a dielectric material is disposed between the first electrode 10 and the second electrode 20, thereby forming the capacitor C. This results in a state in which the capacitor C is disposed between the first connection terminal 11 and the second connection terminal 21, both being drawn from the electronic circuit. Thus, the capacitor can be disposed within the electronic circuit, and not just between the electronic circuit and the opposite substrate.

As shown in FIG. 5A, the first electrode 10 may be formed on the surface of the first stress-relaxation layer 31, the second electrode 20 may be formed on the surface of the second stress-relaxation layer 32, and the second stress-relaxation layer 32 may be used as a dielectric layer. Also, the connection terminal 11 may be made to function as the first electrode 10, as shown in FIG. 6A, in place of the first layer wiring 12. Also, the internal wiring 11a may be made to function as the first electrode 10 as shown in FIG. 6B.

By making the inner surface of the second electrode 20 a corrugated surface similarly to the first embodiment, the capacitance value of the capacitor C can be increased. Also, by making the inner surface of the first electrode 10 a corrugated surface similarly to the second and third embodiments, the capacitance value of the capacitor C can be increased. Accordingly, the electronic board 1 having excellent electrical characteristics can be provided.

Sixth Embodiment

Figure 8:
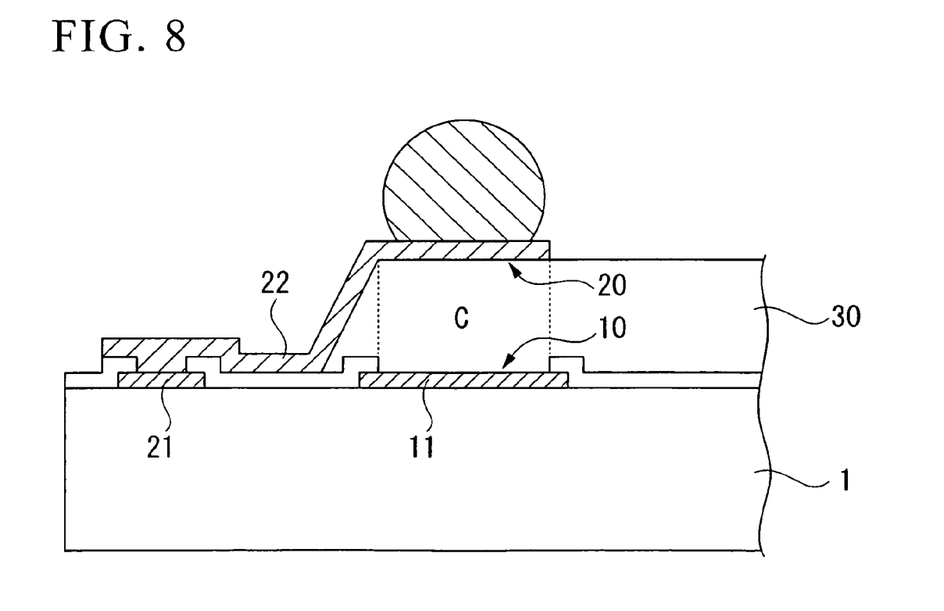
FIG. 8 is a longitudinal sectional view of the semiconductor chip according to the sixth embodiment.

FIG. 8 is a side sectional view of the semiconductor chip according to the sixth embodiment.

The semiconductor chip according to the sixth embodiment adds the capacitor structure shown in FIG. 6A to the rearrangement wiring structure shown in FIGS. 1A and 1B. Thereby, the first connection terminal 11 and the second connection terminal 21 of the semiconductor chip 1 become connected to a single mounting terminal for the opposite substrate (not shown). This results in a state in which the capacitor C is disposed between the mounting terminal and the first connection terminal 11.

Thus a capacitor can be disposed in various modes by combining the structures of the aforementioned embodiments.

Electronic Device

Next an example of an electronic device provided with the aforementioned semiconductor chip (electronic board) shall be explained with reference to FIG. 8.

Figure 9:
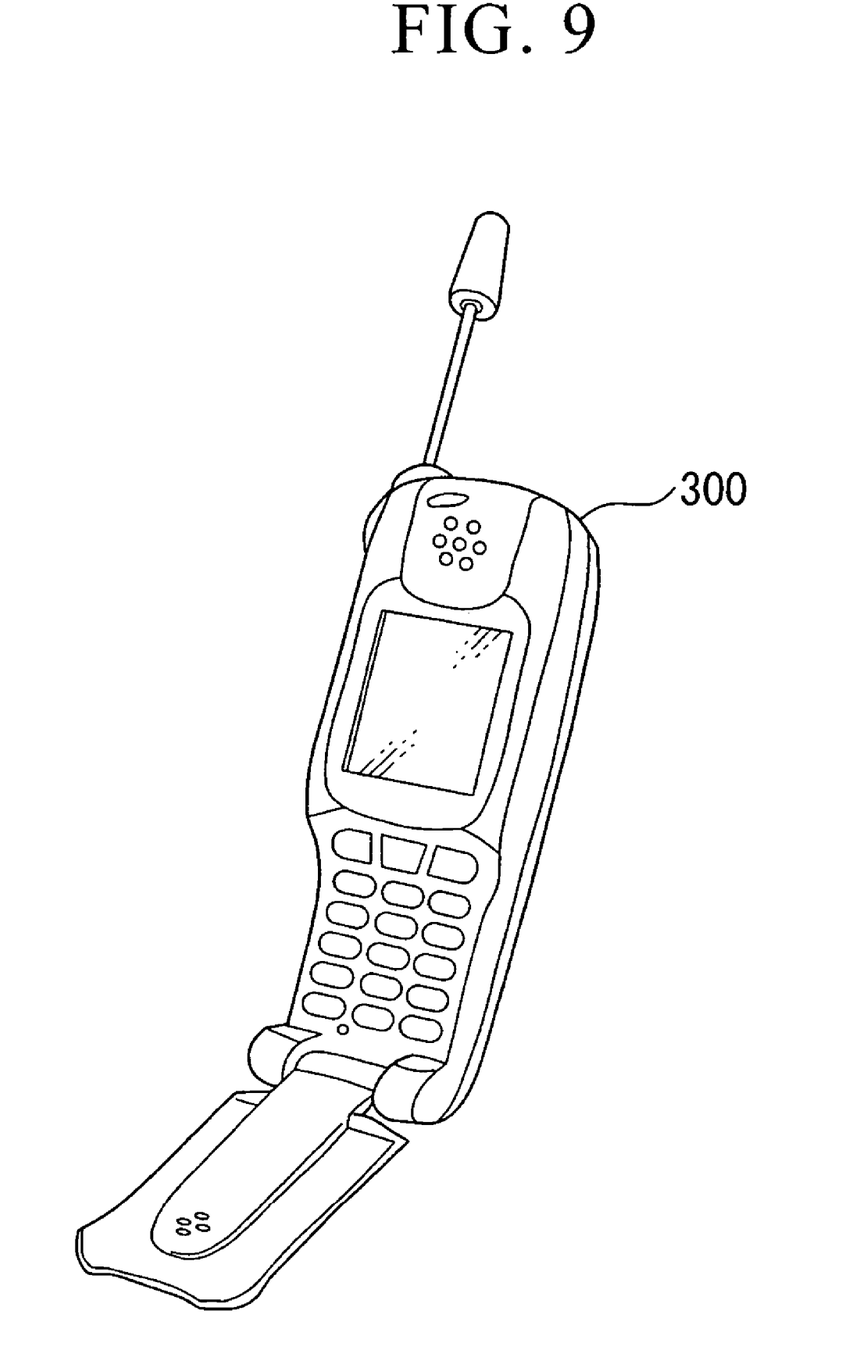
FIG. 9 is a perspective view of a mobile telephone.

FIG. 9 is a perspective drawing of a mobile telephone. The aforementioned semiconductor chip is disposed inside the case of a mobile telephone 300.

The aforementioned semiconductor device is applicable to various electronic devices in addition to mobile phones. For example, it can be applied to a liquid crystal projector, a multimedia PC, an engineering workstation (EWS), a pager, a word processor, a television, a viewfinder video tape recorder or a monitor direct view video tape recorder, a personal digital assistant, a desktop electronic calculator, a car navigation device, a point of sales terminal (POS), a device including a touch panel, and the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, a capacitor was formed on the surface of the semiconductor chip in the embodiments disclosed above. However, the capacitor may be formed on the back surface of the semiconductor chip, and conduction with the surface may be ensured by through electrodes. In addition, although the capacitor was formed in a semiconductor chip on which an electronic circuit was formed in each of the aforementioned embodiments, a capacitor may also be formed on an electronic board consisting of an insulating material.

What is claimed is:

1. An electronic board comprising:
  a substrate on which is formed an electronic circuit having a connection terminal;
  a stress-relaxation layer formed on the substrate and including a dielectric material;
  a capacitor having a first electrode that is disposed between the substrate and the stress-relaxation layer; a second electrode that is disposed at the top side of the stress-relaxation layer; and a portion of the stress-relaxation layer that is disposed between the first electrode and the second electrode;
  a first layer wiring that is extended from the connection terminal, a part of the first layer wiring being covered by the stress-relaxation layer;
  a second layer wiring that is disposed at the to side of the stress-relaxation layer and is a rearrangement wiring for the connection terminal; and
  a projection electrode that is formed on the surface of the second electrode and is mounted on a connection terminal of an opposite substrate, which is a substrate on which the electronic board is mounted, wherein
  at least one of the first electrode and the second electrode has a corrugated surface facing the stress-relaxation layer,
  in an overlap region where the first layer wiring and the second layer wiring overlap when the electronic board is viewed from a direction perpendicular to a surface of the electronic board, a portion of the first layer wiring in the overlap region forms the first electrode,
  a portion of the second layer wiring in the overlap region forms the second electrode, and
  the projection electrode, the capacitor, and the corrugated surface are disposed at the overlap region.

2. An electronic board according to claim 1, wherein
  a passivation film of the substrate is disposed between the substrate and the stress-relaxation layer,
  the first electrode is disposed between the substrate and the passivation film, and
  at the overlap region, the passivation film has an opening for the first electrode.

3. An electronic board according to claim 1, wherein
  a passivation film of the substrate is disposed between the substrate and the stress-relaxation layer,
  the first electrode is disposed between the substrate and the passivation film, and
  the passivation film has no opening for the first electrode.

4. An electronic board according to claim 1, wherein the stress-relaxation layer is made of a material in which ceramic powder is dispersed in the dielectric material.

5. An electronic board according to claim 4, wherein the dielectric material is a resin material having photosensitivity.

6. An electronic board comprising:
  a substrate on which is formed an electronic circuit having a connection terminal;
  a first stress-relaxation layer formed on the substrate and having a dielectric material;
  a second stress-relaxation layer formed on the first stress-relaxation layer;
  a capacitor having a first electrode that is disposed between the first stress-relaxation layer and the second stress-relaxation layer; a second electrode that is disposed at a top side of the second stress-relaxation layer; and a portion of the second stress-relaxation layer that is disposed between the first electrode and the second electrode, wherein a first layer wiring that is extended from the connection terminal and is formed on the first stress-relaxation layer, a part of the first layer wiring being covered by the first stress-relaxation layer;

a second layer wiring that is disposed at the to side of the second stress-relaxation layer; and a projection electrode that is formed on the surface of the second electrode and is mounted on a connection terminal of an opposite substrate, which is a substrate on which the electronic board is mounted, wherein at least one of the first electrode and the second electrode has a corrugated surface facing the second stress-relaxation layer, in an overlap region where the first layer wiring and the second layer wiring overlap when the electronic board is viewed from a direction perpendicular to a surface of the electronic board, a portion of the first layer wiring in the overlap region forms the first electrode, a portion of the second layer wiring in the overlap region forms the second electrode, and the projection electrode, the capacitor, and the corrugated surface are disposed at the overlap region.

7. An electronic board according to claim 6, wherein the first stress-relaxation layer has a corrugated surface adjacent to the first electrode.

8. An electronic board according to claim 1, wherein a transistor of the electronic circuit is disposed at the overlap region.

* * * * *